(12) United States Patent
Gaidis

(10) Patent No.: US 8,338,869 B2
(45) Date of Patent: Dec. 25, 2012

(54) SIDEWALL COATING FOR NON-UNIFORM SPIN MOMENTUM-TRANSFER MAGNETIC TUNNEL JUNCTION CURRENT FLOW

(75) Inventor: Michael C. Gaidis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/100,123

(22) Filed: May 3, 2011

(65) Prior Publication Data

US 2011/0204459 A1 Aug. 25, 2011

Related U.S. Application Data

(62) Division of application No. 12/433,023, filed on Apr. 30, 2009, now Pat. No. 7,989,224.

(51) Int. Cl.
*H01L 21/02* (2006.01)
*H01L 47/00* (2006.01)
(52) U.S. Cl. ............... 257/295; 257/4; 257/E21.665
(58) Field of Classification Search .......... 257/295, 257/E21.665
See application file for complete search history.

(56) References Cited

U.S. PATENT DOCUMENTS

| 6,911,156 | B2 | 6/2005 | Grynkewich et al. |
| 7,374,952 | B2 | 5/2008 | Kasko et al. |
| 2004/0166640 | A1 | 8/2004 | Yagami et al. ............. 438/277 |
| 2005/0258469 | A1 | 11/2005 | Guo ............................ 257/314 |
| 2007/0166840 | A1 | 7/2007 | Assefa et al. |
| 2008/0211055 | A1 | 9/2008 | Assefa et al. |
| 2009/0104718 | A1 | 4/2009 | Zhong et al. |

FOREIGN PATENT DOCUMENTS

JP 2006295198 A 10/2006
KR 20080045122 5/2008

*Primary Examiner* — Matthew Landau
*Assistant Examiner* — Daniel Luke
(74) *Attorney, Agent, or Firm* — Thomas Grzesik; Fleit Gibbons Gutman Bongini & Bianco PL

(57) ABSTRACT

A magnetic tunnel junction device comprises a substrate including a patterned wiring layer. A magnetic tunnel junction (MTJ) stack is formed over the wiring layer. A low-conductivity layer is formed over the MTJ stack and a conductive hard mask is formed thereon. A spacer material is then deposited that includes a different electrical conductivity than the low conductivity layer. The spacer material is etched from horizontal surfaces so that the spacer material remains only on sidewalls of the hard mask and a stud. A further etch process leaves behind the sidewall-spacer material as a conductive link between a free magnetic layer and the conductive hard mask, around the low-conductivity layer. A difference in electrical conductivity between the stud and the spacer material enhances current flow along the edges of the free layer within the MTJ stack and through the spacer material formed on the sidewalls.

9 Claims, 6 Drawing Sheets

SIDEWALL COATING FOR NON-UNIFORM SPIN MOMENTUM-TRANSFER MAGNETIC TUNNEL JUNCTION CURRENT FLOW

CROSS REFERENCE TO RELATED APPLICATION

The present patent application is a divisional application of U.S. patent application Ser. No. 12/433,023, now U.S. Pat. No. 7,989,224, which was filed on Apr. 30, 2009, and commonly assigned herewith to International Business Machines, and which is hereby incorporated by reference in its entirety.

FIELD OF THE INVENTION

The present invention generally relates to the field of semiconductors, and more particularly relates to magneto-resistive random access memory (MRAM) comprising a sidewall coating for non-uniform Spin Momentum Transfer (SMT) magnetic tunnel junction (MTJ) current flow, and a method for fabricating the same.

BACKGROUND OF THE INVENTION

State-of-the-art methods for storing data in SMT MRAM generally require high current levels to switch the free layer between high and low resistance states. These high current levels are undesirable since they require large switching transistors, and consequently large cell sizes. In-plane magnetization materials and devices are presently far simpler to create than out-of-plane magnetization structures, but the spin torque coupling from electron spins to the MTJ free layer is nearly absent when the magnetic moment of the MTJ free layer is in-plane (parallel to tunnel barrier). This is because the electrons traverse the tunnel barrier in a direction nearly perpendicular to the in-plane MTJ free layer magnetization. With in-plane magnetization devices, for the spin torque effect to begin to switch the MTJ free layer, one generally waits for thermal fluctuations to give the free layer a substantial out-of-plane magnetization. This is a poorly controlled approach, and leads to soft errors, slow write times, and the need for high switching currents.

SUMMARY OF THE INVENTION

In view of the problems discussed above, it would be valuable to create a structure where one increases the relative amount of current flow along the edges of a device with in-plane magnetization, as the edges of the device will exhibit magnetization with a substantial out-of-plane component, due to magnetic edge effects. The higher current in edge regions where out-of-plane magnetization is present would make for more efficient transfer of spin torque from the electrons to the MTJ free layer, as the spin torque coupling is substantial only for the out-of-plane component of magnetization of the MTJ free layer.

In one embodiment, a method for fabricating a MTJ device is disclosed. The method comprises forming a seed layer over a patterned wiring layer. An anti-ferromagnetic layer is formed over the seed layer. Reference layers are formed over the anti-ferromagnetic layer. The anti-ferromagnetic layer pins the reference layers. An insulating tunnel barrier layer is formed over the reference layers. A free magnetic layer is formed over the insulating layer. A low (electrical) conductivity layer is formed over the free layer. A conductive hard mask is formed over the low-conductivity layer. The hard mask and low-conductivity layer are etched down to the free layer. A spacer material is deposited over the etched structure. The spacer material comprises a different electrical conductivity than the low conductivity layer. The spacer material is etched from horizontal surfaces so that the spacer material remains only on sidewalls of the hard mask and the stud. The device is further defined by etching the stack materials which are not protected by the hard mask or the sidewall-spacer material. This etch is tuned to leave behind the sidewall-spacer material as a conductive link between the free layer and the conductive hard mask, around the low-conductivity layer.

In another embodiment a magnetic tunnel junction device is disclosed. The magnetic tunnel junction device comprises a substrate including a patterned wiring layer. A magnetic tunnel junction stack is formed over the wiring layer. A low-conductivity layer is formed over the magnetic tunnel junction stack. A conductive hard mask is formed over the low-conductivity layer. The hard mask and low-conductivity layer are etched down to the free layer. A spacer material is deposited over the etched structure. The spacer material comprises a different electrical conductivity than the low conductivity layer. The spacer material is etched from horizontal surfaces so that the spacer material remains only on sidewalls of the hard mask and the stud. The device is further defined by etching the stack materials which are not protected by the hard mask or the sidewall-spacer material. This etch is tuned to leave behind the sidewall-spacer material as a conductive link between the free layer and the conductive hard mask, around the low-conductivity layer. A difference in electrical conductivity between the stud and the spacer material enhances current flow along the edges of the free layer within the magnetic tunnel junction stack and through the spacer material formed on the sidewalls.

In yet another embodiment, an integrated circuit is disclosed. The integrated circuit comprises a circuit supporting substrate having an electrical circuit disposed thereon and a magnetic tunnel junction device. The magnetic tunnel junction device comprises a substrate including a patterned wiring layer. A magnetic tunnel junction stack is formed over the wiring layer. A low-conductivity layer is formed over the magnetic tunnel junction stack. A conductive hard mask is formed over the low-conductivity layer. The hard mask and low-conductivity layer are etched down to the free layer. A spacer material is deposited over the etched structure. The spacer material comprises a different electrical conductivity than the low conductivity layer. The spacer material is etched from horizontal surfaces so that the spacer material remains only on sidewalls of the hard mask and the stud. The device is further defined by etching the stack materials which are not protected by the hard mask or the sidewall-spacer material. This etch is tuned to leave behind the sidewall-spacer material as a conductive link between the free layer and the conductive hard mask, around the low-conductivity layer. A difference in electrical conductivity between the stud and the spacer material enhances current flow along the edges of the free layer within the magnetic tunnel junction stack and through the spacer material formed on the sidewalls.

DETAILED DESCRIPTION

As required, detailed embodiments of the present invention are disclosed herein; however, it is to be understood that the disclosed embodiments are merely examples of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure and function. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Figure 1:
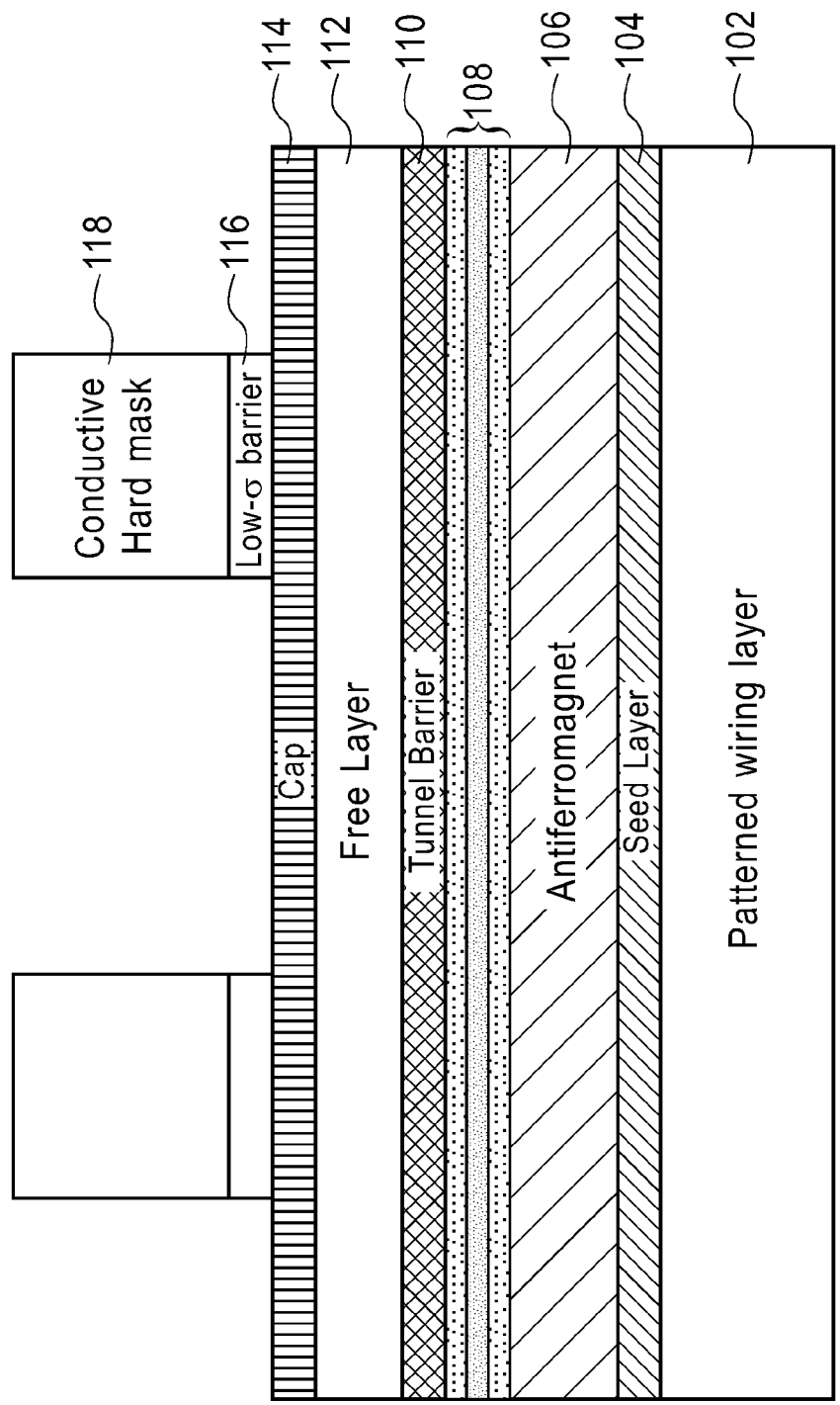
FIGS. 1-3 are cross-section illustrations describing a process for fabricating magnetic tunnel junction devices according to one embodiment of the present invention.

FIG. 1 shows an underlying patterned wiring layer 102, on which a seed layer 104 is deposited. An anti-ferromagnetic layer 106 is deposited over the seed layer 104. The seed layer 104 is used to obtain a desired crystal orientation of the anti-ferromagnetic (AF) layer 106. Reference layers 108 are then deposited over the anti-ferromagnetic layer 106 and an MTJ barrier layer 110 is deposited over the top most reference layer. A free layer 112 is then deposited over the MTJ barrier layer.

The AF layer 106, reference layers 108. MTJ barrier layer 110, and the free layer 112 create a MTJ stack. In particular, the reference layers 108 create a first magnetic layer and the free layer 112 creates a second magnetic layer of the MTJ stack. The MTJ barrier layer 110 creates an insulating layer between the first magnetic layer 108 and the second magnetic layer 112. In one embodiment, the first magnetic layer 108 (the reference layer) has magnetization that is pinned in a particular direction by the AF layer 106. The second magnetic layer 112 (the free layer) has a magnetization direction which is not pinned. The free layer 112 is able to rotate its magnetization to be parallel with the magnetization of the pinned layer 108 or anti-parallel to the magnetization of the pinned layer 108. Parallel magnetizations typically allow current to tunnel through the tunnel barrier 110 with low resistance. Anti-parallel magnetizations result in high resistance. The free layer magnetization direction can be switched by passing current through a nearby wire so that the current induces a magnetic field that interacts with the free layer. The free layer magnetization can also be controlled by injection of spin polarized electrons into the free layer (a process called "spin-momentum transfer" (SMT)).

After free layer 112 is deposited, a cap layer 114 can be deposited to provide a buffer which allows efficient free layer magnetization switching. This optional cap layer 114 can also include materials that allow it to act as an etch stop layer when forming the magnetic tunnel junction structures. The optional cap layer 114 may comprise one or several individual layers, but should be thin enough so it will not allow substantial current spreading. Low-σ barrier layer 116 is then deposited, and will form a low-conductivity impediment to electron flow in the vertical direction. The conductivity of barrier layer 116 is chosen to be substantially less than that of the surrounding conductors, so electrons will prefer to travel through the surrounding conductors. A conductive hard mask layer 118 is deposited atop the barrier layer 116 to provide an etch mask for MTJ device definition, and to provide a conductive layer to bridge between the MTJ and the wiring layer to be defined above the MTJ. It should be noted that any conventional fabrication processes can be used to deposit/form the layers discussed above.

One or more lithographic or similar processes can then be used for pattern creation. The hard mask 118 is then etched using a desirable chemical and/or physical method such as (but not limited to) reactive ion etching (RIE), ion beam etching (IBE), or wet chemical etching. The low-σ barrier layer 116 is etched into the same shape as hard mask 118, but the etch stops short of removing the entire height of the free layer 112. In FIG. 1 is shown an embodiment where two nearby devices have been patterned and the etch has been halted by a low-etch-rate material in the cap layer 114, but note that one may also stop the etch inside or at the bottom of cap layer 114, or inside the free layer 112.

Figure 2:
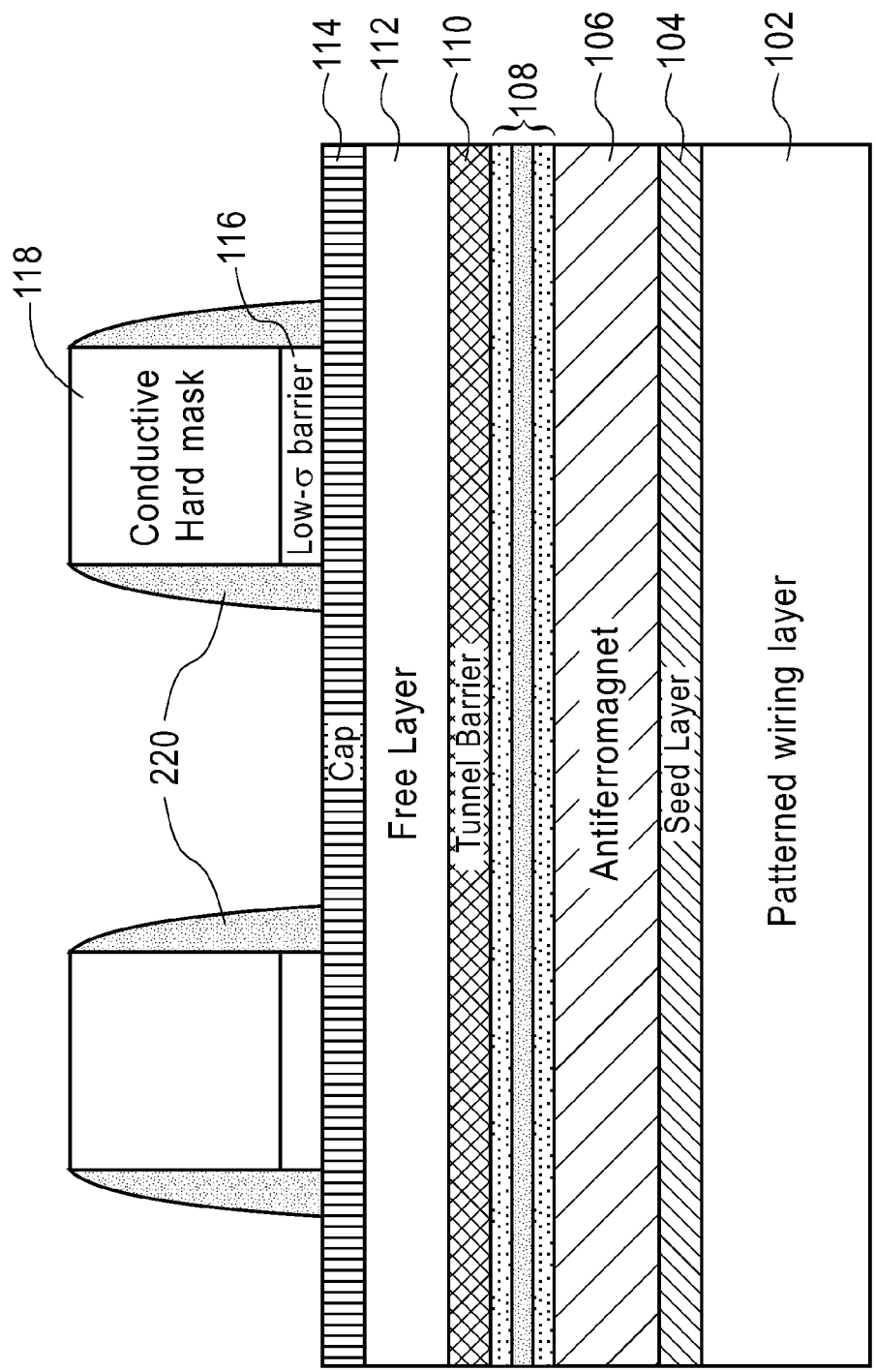

Once the etching process discussed above has been completed, a spacer film 220 is deposited over the structure with substantial coverage of the vertical sidewalls of the structure. After the spacer 220 has been deposited, a directional (anisotropic) etch is used to remove material on horizontal surfaces, thus leaving behind spacer material only on the sidewalls as shown in FIG. 2. This can be accomplished, for example, with high substrate bias during RIE, or with highly directional IBE techniques. In one embodiment, a high conductivity spacer material is used for a structure 400 such as that shown in FIG. 4. In another embodiment a ferromagnetic spacer material is used for a structure 500 such as that shown in FIG. 5. In yet another embodiment, a low conductivity spacer material is used for a structure 600 such as that shown in FIG. 6.

It should be noted that a directional deposition process with a rotating substrate can be utilized for depositing the spacer material 220, resulting in enhanced sidewall coverage. For example, ion beam deposition, e-beam deposition, thermal evaporation, and the like can be used in conjunction with a tilted and rotating substrate holder to deposit the spacer material 220. Other processes such as electroplating, electroless plating, chemical vapor deposition (CVD), and atomic layer deposition (ALD) can also be used to deposit the spacer material 220. It should be noted for the structure 500 in FIG. 5, the ferromagnetic spacer can be anisotropically patterned such that it does not coat all sides of the MTJ stack to prevent poorly defined magnetic states. This can be accomplished by using directional ion beam etching or directional deposition to coat just one side of the device with the ferromagnet or to damage/demagnetize one side of the device so as to leave only part of the device coated with a strong ferromagnet.

Figure 3:
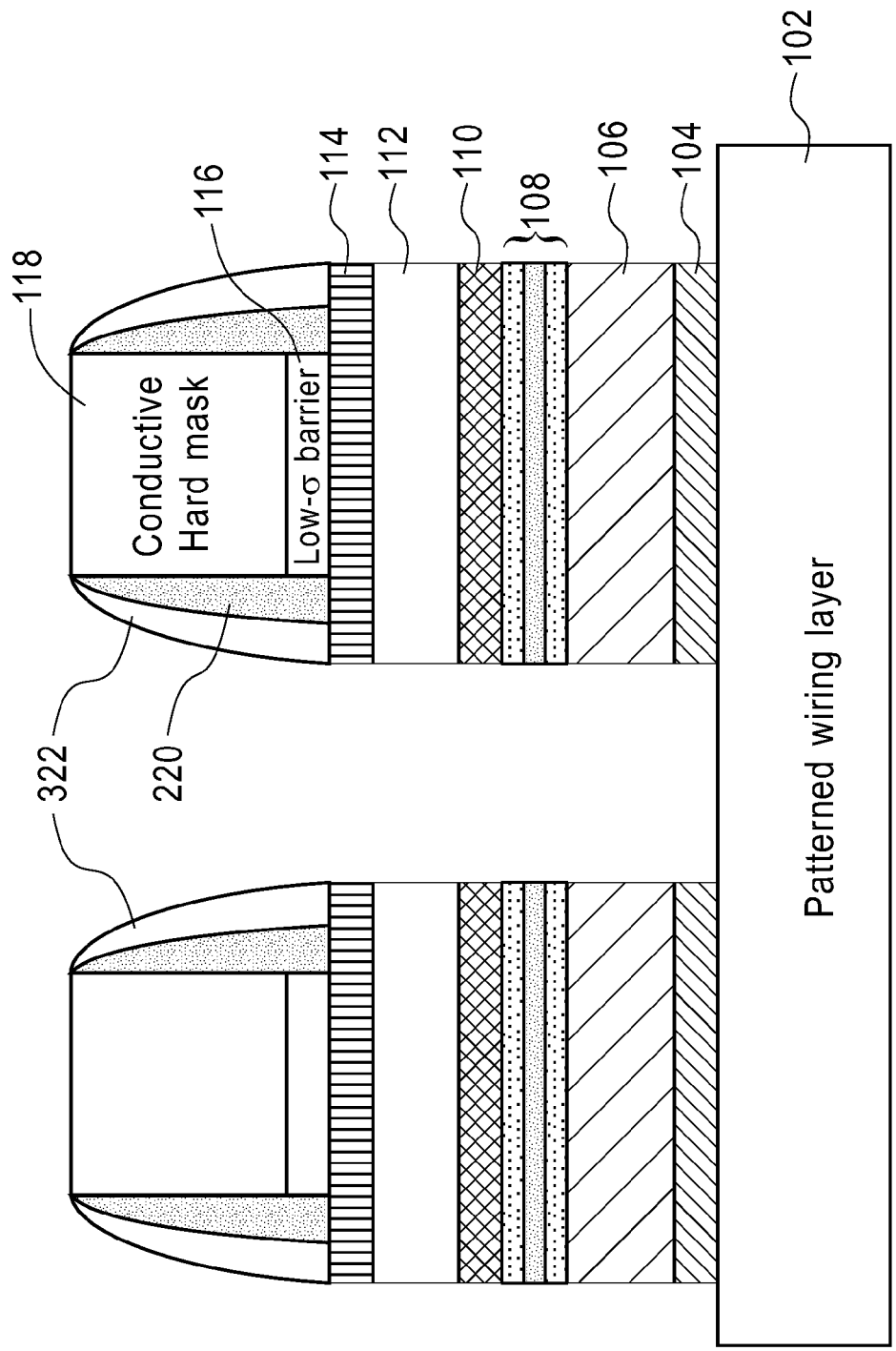

After etching to define the spacer as shown in FIG. 2, the free layer 112 and pinned layer 106, 108 (and underlying seed layer 104) are patterned so neighboring devices can be isolated from one another to be individually addressed by the electronic device circuitry, as shown in FIG. 3. One way of accomplishing this is to extend the anisotropic "spacer" etch discussed above such that the etch goes all the way through the magnetic films and isolates the devices as shown in FIG. 3. In this embodiment, the spacer is robust enough to remain on the device sidewalls even after the full stack etch is complete.

Alternatively, an additional spacer 322 can be deposited for masking purposes (rather than for its conductivity or magnetic properties) to allow for a full stack etch without erosion of the spacer 220 (which is chosen for conductive or magnetic properties). Also, the stack can be etched part-way and additional lithography and/or hard mask generation steps can be performed to allow for a more flexible etch scheme to pattern the remaining bottom layers. Techniques can also be used to damage the materials so they become inactive, rather than completely removing the materials in a physical sense. This process is further discussed in the commonly owned U.S. Pat. No. 7,212,446, entitled "Method Of Patterning A Magnetic Tunnel Junction Stack For A Magneto-Resistive Random Access Memory", which is hereby incorporated by reference in its entirety.

It should be noted that flexibility in choice of the sidewall material 220 discussed above, can be enhanced by using a protective spacer 322 around the functional spacer 220. Such an extra spacer can enable more choices for sidewall angle, and can prevent functional spacer loss in the ensuing stack etching discussed above. One example of a protective spacer 322 material is tantalum, which can protect a ruthenium undercoat (functional spacer 220 material) during methanol-based RIE of the magnetic stack. After the process discussed above with respect to FIG. 3, conventional fabrication processes can be used to contact the tops of the devices. The underlying patterned wiring layer 102 provides contact to the bottoms of the devices.

Figure 4:
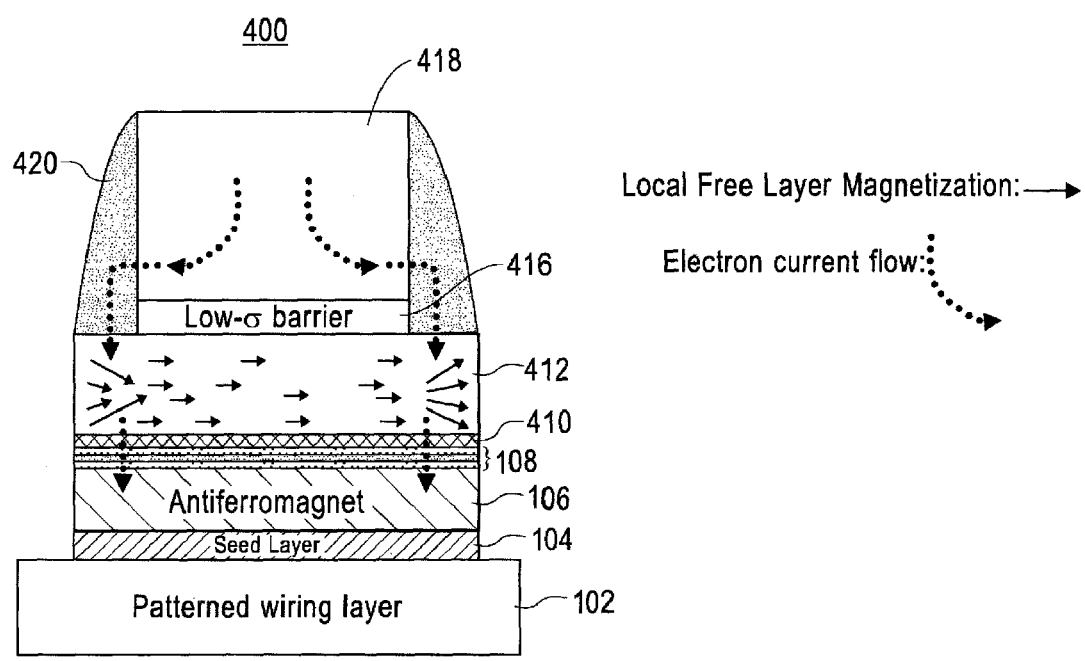
FIG. 4 shows a magnetic tunnel junction device comprising a low electrical conductivity stud and a high electrical conductivity spacer material according to one embodiment of the present invention.

FIG. 4 shows one structure of device 400 resulting from the processes discussed above with respect to FIGS. 1-3. In particular, FIG. 4 shows a device 400 with a low electrical conductivity current barrier 416 and a high electrical conductivity functional spacer 420. This configuration of the higher electrical conductivity functional spacer 420 being formed around the lower electrical conductivity barrier 416 enables current to flow preferentially at the edges of the MTJ where edge effects cause a substantial part of the free layer magnetization to lie out-of-plane. The local magnetization in the free layer is represented by the solid arrows within the free layer 412. The current flow is represented by the thick dashed arrows in device 400. This effect is enhanced for more-transmissive tunnel barriers 410 and more-resistive free layers 412, which reduces current-spreading effects.

Figure 5:
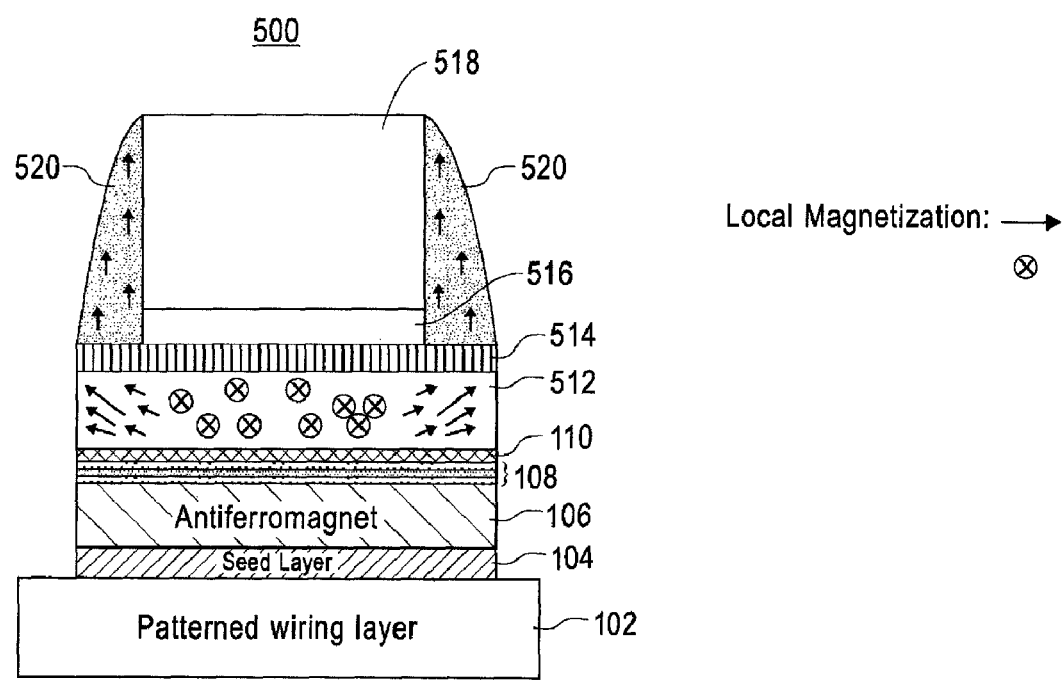
FIG. 5 shows a magnetic tunnel junction device comprising a ferromagnetic spacer material formed on at least a portion of the conductive stud and spacer material according to one embodiment of the present invention.

FIG. 5 shows another device 500 resulting from the processes discussed above with respect to FIGS. 1-3. In particular, FIG. 5 shows a device 500 with a central region 516 and 518 which form a stud/hard mask combination. Electrical conductivity of layers 516 and 518 can be chosen similar to layers 416 and 418 of FIG. 4, or can assume other conductivity values as the current flow in this device is only one aspect of the device improvement. The additional improvement is realized through formation of a ferromagnetic layer 520 as the spacer around the central stud/hard mask combination. With proper film deposition conditions and film aspect ratio, one can make the magnetization of layer 520 point substantially perpendicular to the plane of the free layer. The use of nonmagnetic layer 514 decouples the magnetization in layer 520 from that of the free layer 512, so that free layer magnetization is allowed to switch direction without need for layer 520 to switch direction. However, layer 520 influences free layer 512 through demagnetization fields in a way similar to that shown in FIG. 5. The free layer magnetization near the edges of the free layer assumes a substantial out-of-plane component due to the influence of layer 520 demagnetization fields. Compared to a conventional device with in-plane magnetization free layer, this free layer 512 has an out-of-plane component which provides for faster and lower-current switching of the free layer due to the nature of the spin-momentum transfer effect.

It should be noted that the device 500 of FIG. 5 is designed, in one embodiment, in such a way that there are two stable and reliable states for the free layer to switch into. Device 500 illustrates the case where shape anisotropy or intrinsic anisotropy of the free layer causes free layer magnetization to point into (or out of) the page, and the magnetization direction of the pinned reference layers will also point into (or out of) the page. The free layer switches between high and low resistance states as magnetization flips between going into the page and going out of the page. For example, this could be achieved by creating a long, narrow device with long axis pointing into the page, and with FIG. 5 representing a cross-section across the short axis. In such a case, the shape anisotropy induces the free layer magnetization to point into (or out of) the page. The spacer layer 520 influences the magnetization of the free layer 512 to tilt it out-of-plane in a direction substantially perpendicular to the nominal free layer magnetization direction, so that the free layer magnetization exhibits stable states pointing either into or out of the page. There can be some frustration of magnetization direction due to layer 520 at the narrow tips of the fore mentioned long, narrow device, but these effects can be minimized with choice of device shape, directional deposition of layer 520, or magnetic properties of layer 520.

Figure 6:
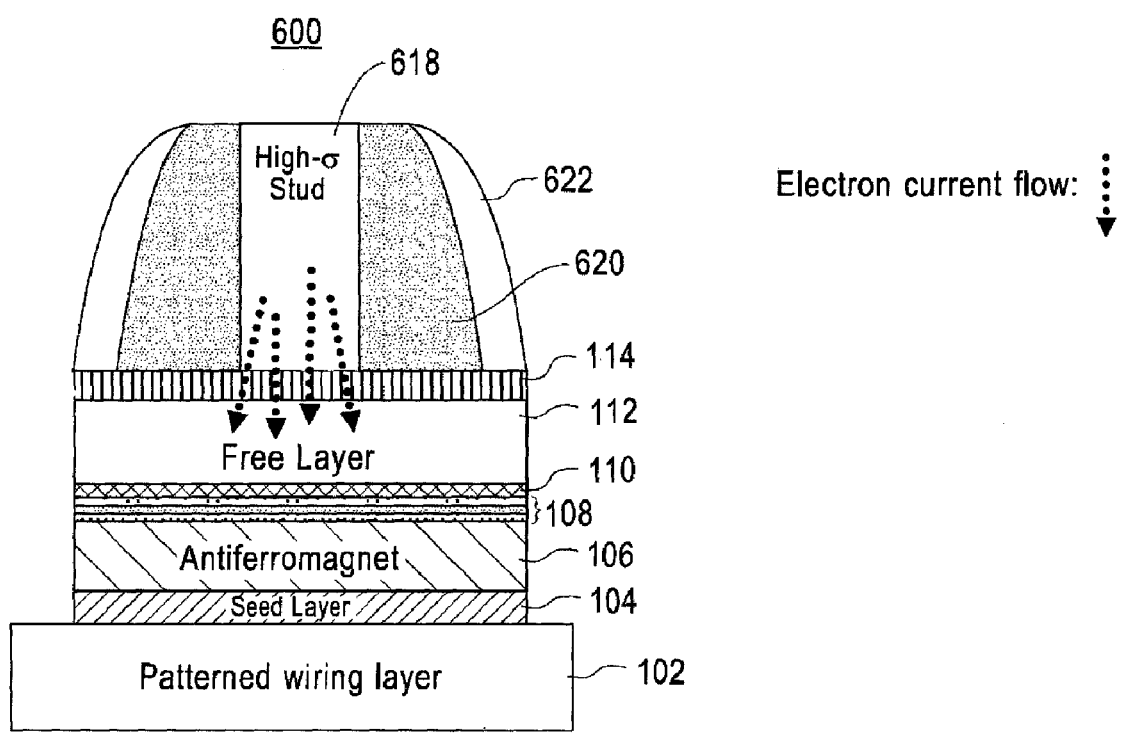
FIG. 6 shows a magnetic tunnel junction device comprising a high electrical conductivity stud and a low electrical conductivity spacer material according to one embodiment of the present invention.

FIG. 6 shows another device 600 resulting from the processes discussed above with respect to FIGS. 1-3. In particular, FIG. 6 shows a device 600 with a high electrical conductivity hard mask/stud 618 and a low electrical conductivity functional spacer 620 formed on all sides of the stud 618. This configuration of the lower electrical conductivity functional spacer 620 being formed on all sides of the higher electrical conductivity stud 618 creates an area of high current density near the center of the device 600. The spin torque effect can be enhanced by creating hotspots of large current density, as opposed to a uniform current flow throughout the entire device. The device 600 can be further tuned with an additional spacer layer 622 that can be formed of high conductivity material (like layer 420 in FIG. 4) or of ferromagnetic material (like layer 520 in FIG. 5).

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The circuit as described above is part of the design for an integrated circuit chip. An integrated circuit chip typically may include one or more circuit supporting substrates each having an electrical circuit disposed thereon The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. Typically, integrated circuit chips include at least one circuit-supporting substrate having an electrical circuit disposed thereon. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

What is claimed is:

1. A semiconductor device comprising:
   a substrate comprising a patterned wiring layer;
   a magnetic tunnel junction stack formed over the patterned wiring layer;
   an intermediate non-magnetic layer formed over the magnetic tunnel junction stack, the intermediate non-magnetic layer comprising a first thickness
   a hard mask formed over the intermediate non-magnetic layer, the hard mask comprising a second thickness; and
   a spacer material formed and contacting at least one sidewall of the hard mask and the intermediate non-magnetic layer, wherein the spacer material comprises a different electrical conductivity than the intermediate non-magnetic layer, and wherein a height of the spacer material is substantially equal to a sum of the first and second thicknesses, and wherein a difference in electrical conductivity between the intermediate non-magnetic layer and the spacer material creates current flow predominantly along at least one side of a free magnetic layer within the magnetic tunnel junction stack; and
   a non-magnetic decoupling layer formed between the intermediate non-magnetic layer and the free magnetic layer of the magnetic tunnel junction stack.

2. The semiconductor device of claim 1, wherein the intermediate non-magnetic layer comprises a low electrical conductivity and the spacer material comprises a high electrical conductivity.

3. The semiconductor device of claim 1, wherein the intermediate non-magnetic layer comprises a high electrical conductivity and the spacer material comprises a low electrical conductivity.

4. The semiconductor device of claim 1, wherein the spacer material is a ferromagnetic material.

5. The semiconductor device of claim 4, wherein the ferromagnetic spacer material is anisotropically patterned to alter a demagnetization field on the free magnetic layer.

6. The semiconductor device of claim 1, further comprising:
   a protective spacer formed over the spacer material.

7. An integrated circuit comprising:
   a circuit supporting substrate having an electrical circuit disposed thereon; and
   a magnetic tunnel junction device including:
      a substrate comprising a patterned wiring layer;
      a magnetic tunnel junction stack formed over the patterned wiring layer, the magnetic tunnel junction stack comprising a free magnetic layer;
      an intermediate non-magnetic layer formed over the magnetic tunnel junction stack, the intermediate non-magnetic layer comprising a first thickness;
      a hard mask formed over the intermediate non-magnetic layer, the hard mask comprising a second thickness; and
      a spacer material formed and contacting at least one sidewall of the hard mask, at least one sidewall of the intermediate non-magnetic layer, and a portion of a top surface of the free magnetic layer, wherein a height of the spacer material is substantially equal to a sum of the first and second thicknesses, and wherein the spacer material comprises a different electrical conductivity than the intermediate non-magnetic layer, wherein a difference in electrical conductivity between the intermediate non-magnetic layer and the spacer material creates current flow predominantly along at least one side of the free magnetic layer within the magnetic tunnel junction stack.

8. The integrated circuit of claim 7, wherein the magnetic tunnel junction device further comprises:
   a non-magnetic decoupling layer formed between the intermediate non-magnetic layer and the free magnetic layer of the magnetic tunnel junction stack.

9. The integrated circuit of claim 7, wherein one of:
   the intermediate non-magnetic layer comprises a low electrical conductivity and the spacer material comprises a high electrical conductivity; and
   the intermediate non-magnetic layer comprises a high electrical conductivity and the spacer material comprises a low electrical conductivity.

* * * * *